(12) United States Patent
Sun et al.

(10) Patent No.: US 11,127,594 B2
(45) Date of Patent: Sep. 21, 2021

(54) MANUFACTURING METHODS FOR MANDREL PULL FROM SPACERS FOR MULTI-COLOR PATTERNING

(71) Applicant: Tokyo Electron Limited, Tokyo (JP)

(72) Inventors: Xinghua Sun, Albany, NY (US); Angelique Raley, Albany, NY (US); Andrew Metz, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 183 days.

(21) Appl. No.: 16/211,520

(22) Filed: Dec. 6, 2018

(65) Prior Publication Data

US 2019/0189444 A1   Jun. 20, 2019

Related U.S. Application Data

(60) Provisional application No. 62/607,822, filed on Dec. 19, 2017.

(51) Int. Cl.
| | |
|---|---|
| *H01L 21/033* | (2006.01) |
| *H01L 21/311* | (2006.01) |
| *H01L 21/3213* | (2006.01) |

(52) U.S. Cl.
CPC .... *H01L 21/0337* (2013.01); *H01L 21/31116* (2013.01); *H01L 21/31127* (2013.01); *H01L 21/31144* (2013.01); *H01L 21/32139* (2013.01)

(58) Field of Classification Search
CPC ......... H01L 21/31116; H01L 21/31127; H01L 21/31144; H01L 21/32139; H01L 21/3086; H01L 21/0337
See application file for complete search history.

(56) References Cited

U.S. PATENT DOCUMENTS

| | | | |
|---|---|---|---|
| 8,003,543 B2 * | 8/2011 | Koh | ..................... H01L 21/0337 438/717 |
| 9,123,656 B1 * | 9/2015 | Hsieh | ................. H01L 29/66795 |
| 2009/0246966 A1 * | 10/2009 | Cho | ................... H01L 21/31058 438/735 |
| 2010/0144150 A1 * | 6/2010 | Sills | .................. H01L 21/31138 438/694 |
| 2012/0118854 A1 * | 5/2012 | Smayling | ........ H01L 21/823456 216/37 |

(Continued)

*Primary Examiner* — Errol V Fernandes
*Assistant Examiner* — Jeremy J Joy
(74) *Attorney, Agent, or Firm* — Rothwell, Figg, Ernst & Manbeck, P.C.

(57) ABSTRACT

Embodiments are disclosed for processing microelectronic workpieces having patterned structures to improve mandrel pull from spacers for multi-color patterning. The disclosed embodiments form patterned structures on a substrate including mandrels, form spacers adjacent the mandrels that are recessed such that a height of the spacers is less than the height of the mandrels, form protective caps over the spacers while exposing top surfaces of the mandrels, and remove the mandrels to leave a spacer pattern with cap protection. The remaining spacer pattern can then be transferred to underlying layers in additional process steps. The recessing of the spacers and formation of the protective caps tends to reduce or eliminate spacer damage suffered by prior solutions during mandrel pull from spacers for multi-color patterning.

27 Claims, 7 Drawing Sheets

(56) References Cited

U.S. PATENT DOCUMENTS

| | | | |
|---|---|---|---|
| 2013/0207270 A1* | 8/2013 | Holmes | H01L 23/485 257/763 |
| 2014/0273363 A1* | 9/2014 | Chiu | H01L 29/785 438/165 |
| 2015/0056724 A1* | 2/2015 | Shieh | H01L 21/845 438/14 |
| 2015/0179435 A1* | 6/2015 | Wu | H01L 21/308 438/702 |
| 2016/0293438 A1* | 10/2016 | Zhou | H01L 21/30655 |
| 2016/0365425 A1* | 12/2016 | Chen | H01L 21/02178 |
| 2017/0178963 A1* | 6/2017 | Weybright | H01L 21/823481 |
| 2017/0338116 A1* | 11/2017 | deVilliers | H01L 21/0332 |
| 2018/0061658 A1* | 3/2018 | Mohanty | H01L 21/02186 |
| 2018/0076035 A1* | 3/2018 | Bergendahl | H01L 21/0337 |
| 2018/0113975 A1* | 4/2018 | Sherazi | H01L 27/0207 |
| 2018/0151416 A1* | 5/2018 | Wu | H01L 21/31144 |

\* cited by examiner

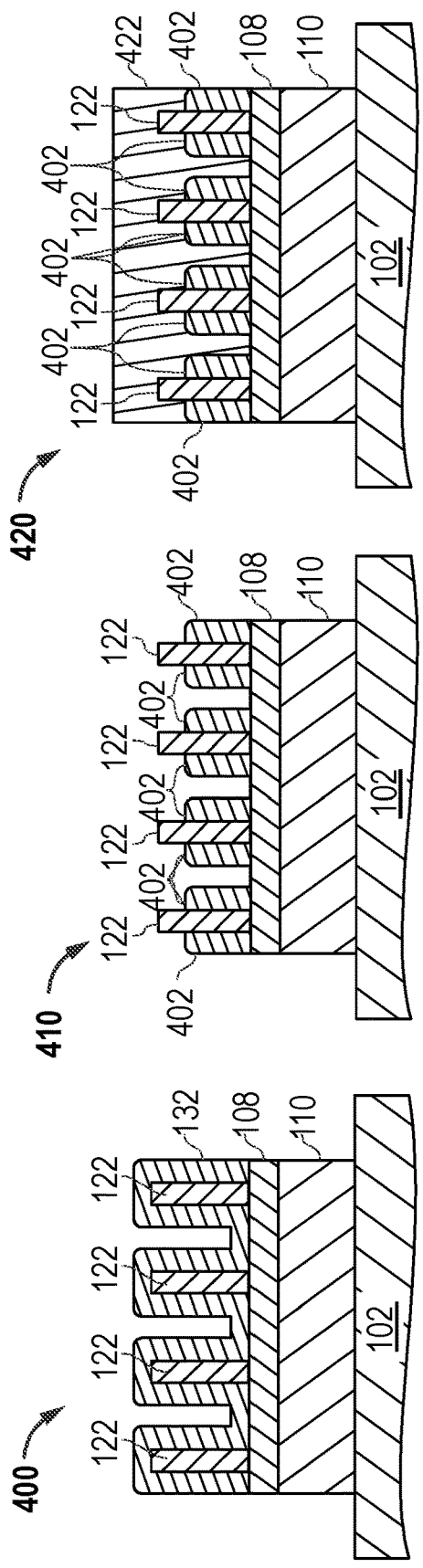
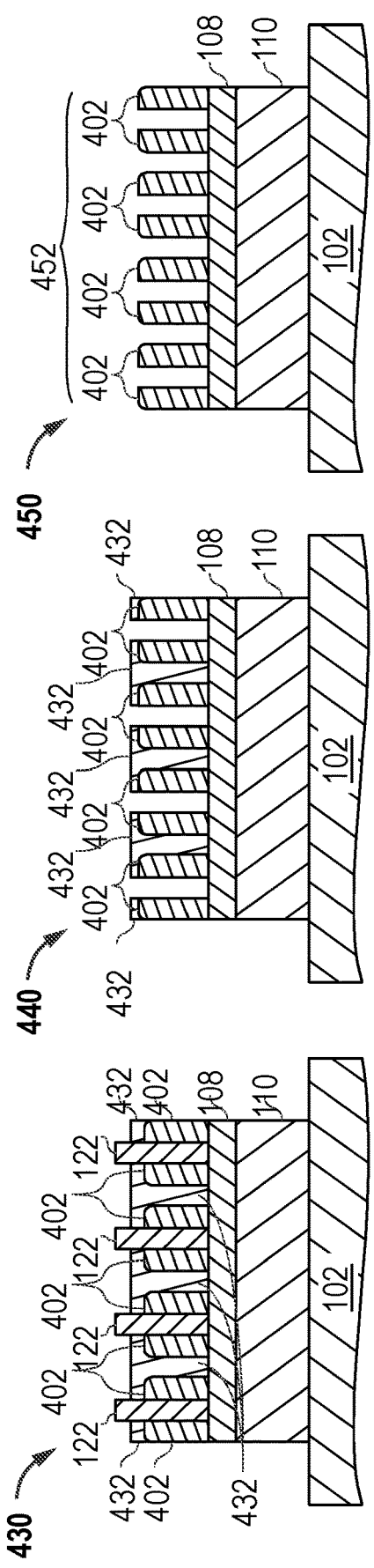
FIG. 4A
FIG. 4B
FIG. 4C
FIG. 4D
FIG. 4E
FIG. 4F

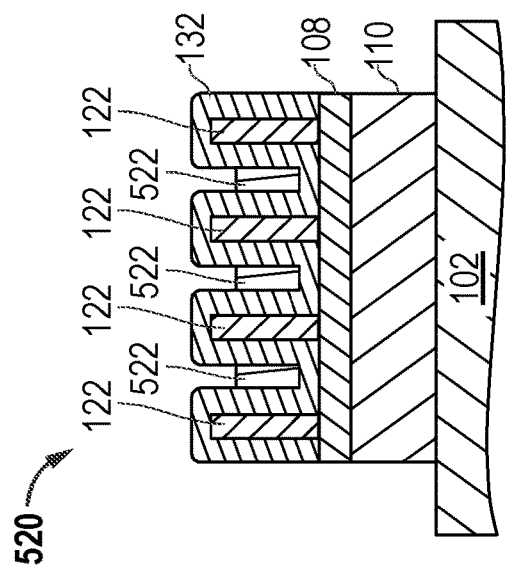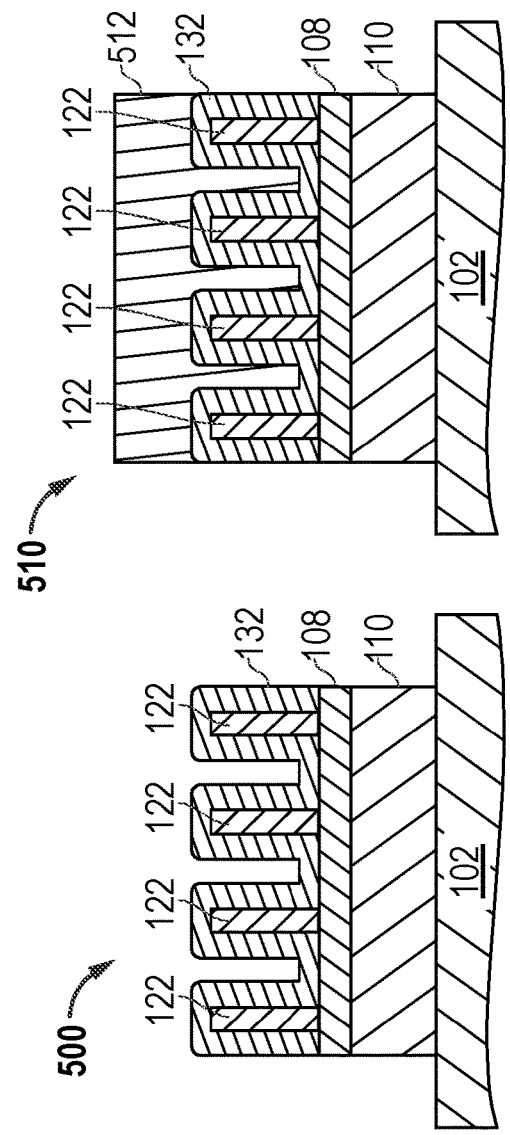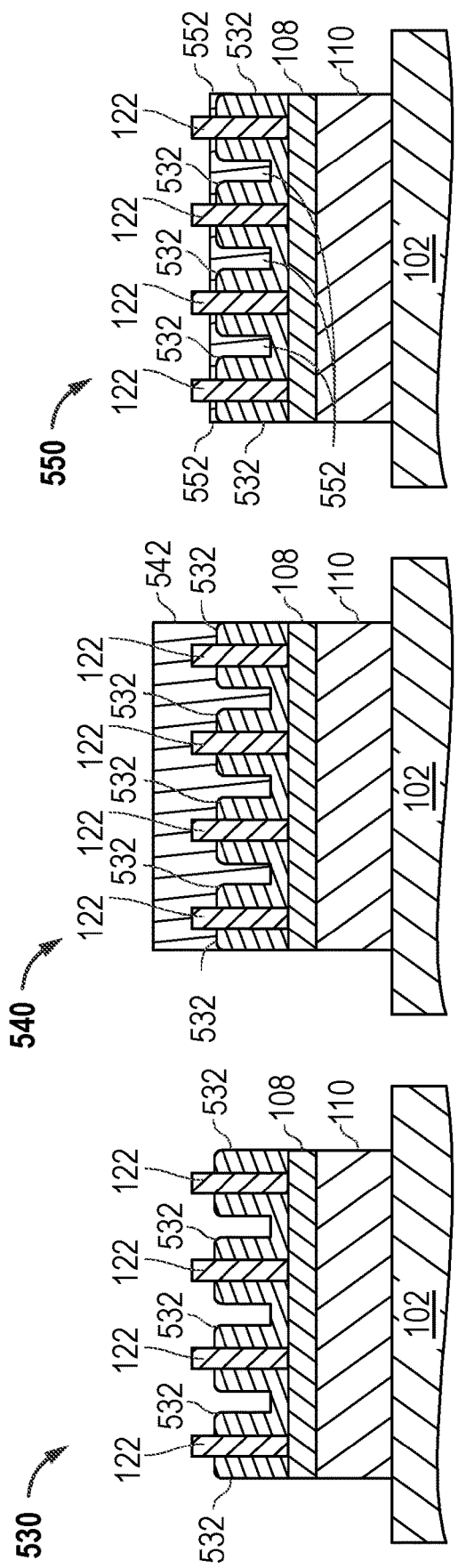

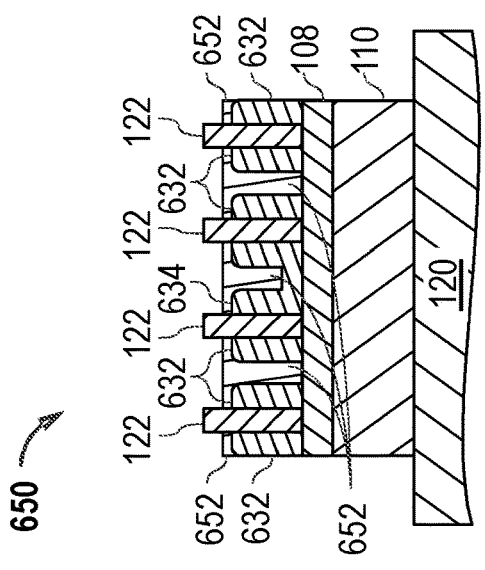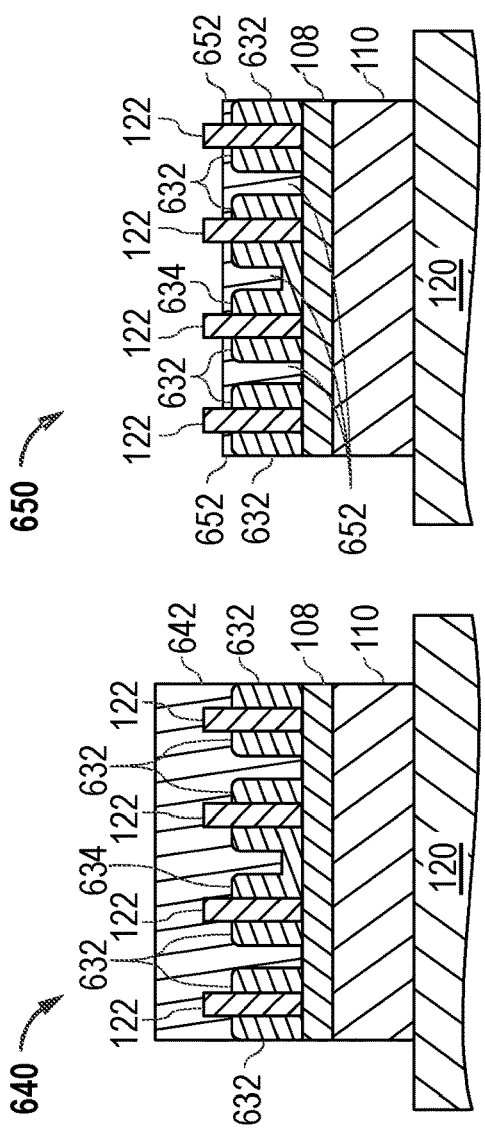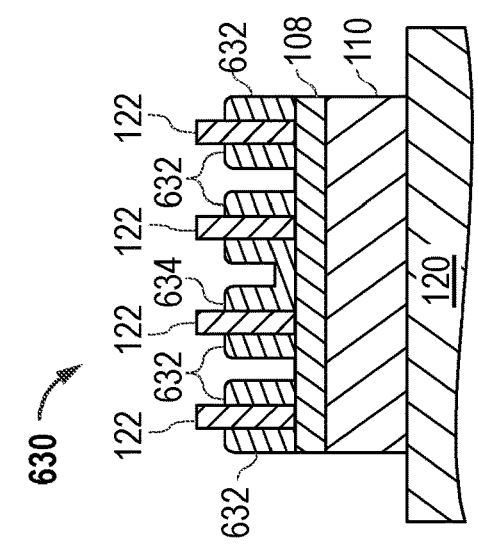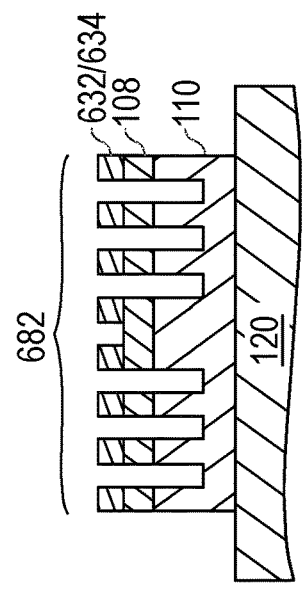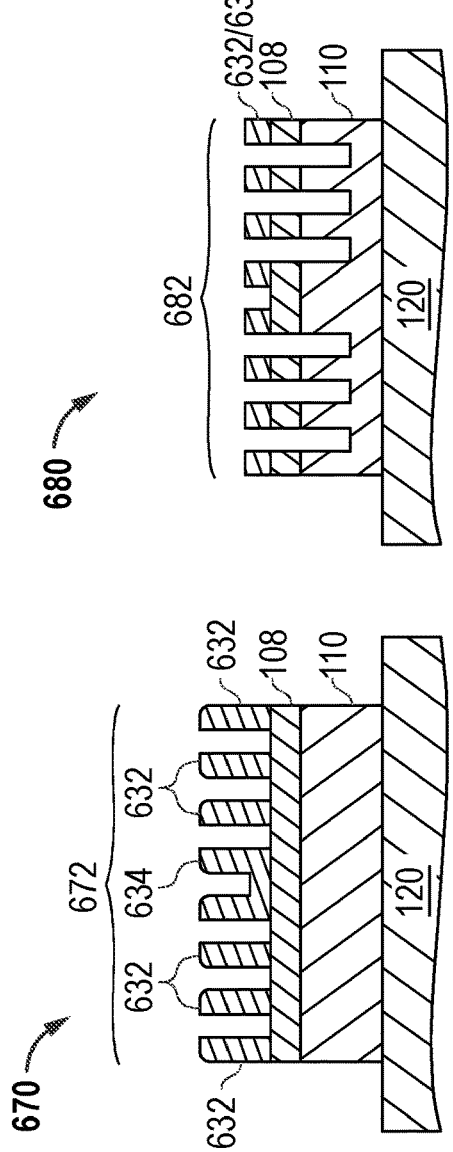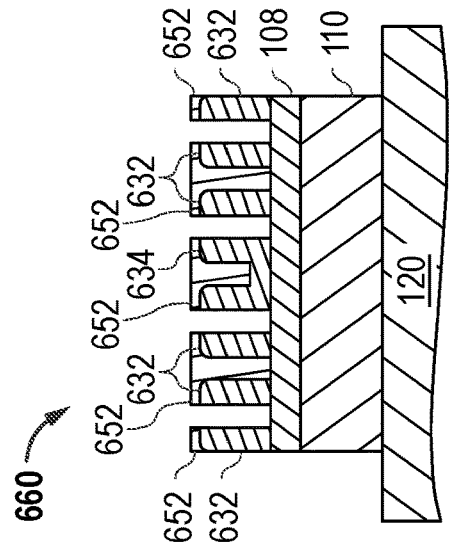

MANUFACTURING METHODS FOR MANDREL PULL FROM SPACERS FOR MULTI-COLOR PATTERNING

CROSS-REFERENCE TO RELATED APPLICATIONS

This application is related to and claims priority to U.S. Provisional Patent Application Ser. No. 62/607,822 filed on Dec. 19, 2017, the entire contents of which are herein incorporated by reference.

BACKGROUND

The present disclosure relates to methods for processing microelectronic workpieces, and in particular, methods for creating patterned structures on the microelectronic workpieces.

Semiconductor device formation involves a series of manufacturing techniques related to the formation, patterning and removal of a number of layers of material on a substrate. To meet the physical and electrical specifications of current and next generation semiconductor devices, processing flows are being requested to reduce feature size while maintaining structure integrity for various patterning processes.

With respect to self-aligned double/multiple patterning (SADP, SAMP) or sidewall image transfer (SIT) for spacer patterning process, mandrels and spacers are two common hardmask materials that can be used to obtain small pitch structure in advanced semiconductor nodes. To accomplish this SADP/SAMP/SIT process, the mandrel pull from adjacent spacers is a critical process step that can affect the overall success of pattern transfer into underlying layers such as metal hardmask layers, low dielectric (low-K) material layers, and/or other underlying layers. For mandrel pull, plasma etch is typically used where a highly anisotropic and highly selective etch is required.

FIGS. 1A-1F (Prior Art) provide example embodiments for a traditional process flow for self-aligned double patterning (SADP) process, side wall transfer (SIT) patterning process, and/or other patterning process that includes a mandrel pull from spacers.

Looking first to FIG. 1A (Prior Art), an example embodiment 100 for material layers and patterned structures is shown after lithography has been used to form pillars 112 of photoresist material on top of a hardmask (HM) 114 that has been formed upon underlying structures over a substrate 102. The lithography process can include optical lithography, extreme ultra-violet (EUV) lithography, and/or other desired lithography processes. For the example embodiment 100, the layers underneath the hardmask layer 114 include an organic layer 104, a mandrel blanket layer 106, a metal layer 108, and a dielectric layer 110. These layers are all on top of the substrate 102 such as a semiconductor substrate for a microelectronic workpiece.

It is noted that the hardmask layer 114 can be, for example, one or more of the following materials including but not limited to tetraethyl orthosilicate (TEOS), silicon oxide ($SiO_x$), low temperature silicon oxide, silicon nitride (SiN), sacrificial SiN, SiCOH, silicon oxynitride (SiON), and/or other hardmask materials. The photoresist material for pillars 112 can be, for example, a positive photoresist material or a negative photoresist. The organic layer 104 can be, for example, one or more of the following materials including but not limited to OPL (organic planarizing layer), SOH (spin-on hardmask), SOC (spin-on carbon) hardmask, and/or other organic layer materials. The mandrel blanket layer 106 can be, for example, one or more of the following materials including but not limited to SiN, $SiO_x$, SiC, nitrogen-doped silicon, metal oxides, metal nitrides, metal, NBLoK (nitrogen barrier low-k material), silicon carbide nitride (SiCN), and/or other desired protective materials. The metal layer 108 can be, for example, one or more of the following materials including but not limited to metal nitrides including titanium nitride (TiN), metal oxides, and/or other metal contact materials. The dielectric layer 110 can, for example, low-K material layer including but not limited to SiCOH, dense SiCOH, porous SiCOH, other porous dielectric materials, and/or other low-K or dielectric materials. It is noted that these are provided as example materials, and additional and/or different materials could also be used.

FIG. 1B (Prior Art) is an example embodiment 120 after an etch process and subsequent strip has been performed to form mandrels 122 below the pillars 112 in FIG. 1A (Prior Art). The etch process can be, for example, a reactive ion etching (RIE) process or other etch process that provides an anisotropic etch of the portions of the hardmask layer 114, the organic layer 104, and mandrel blanket layer 106 that are not covered by the pillars 112. During the etch process, the pillars 112 as well as the portion of the hardmask layer 114 are removed, and organic layer 104 below the pillars 112 is removed by a later strip process. The mandrels 122 are portions of the mandrel blanket layer 106 left above the metal layer 108. It is noted that the etch process can be a plasma etch process including dielectric and/or organic etch process steps, and this plasma etch can include plasma containing fluorocarbons, oxygen, nitrogen, hydrogen, argon, and/or other gases. In addition, this plasma etch can be done in multiple steps with different discharged plasmas for directionally etching the hardmask layer 114 and the organic layer 104.

FIG. 1C (Prior Art) provides an example embodiment 130 after a spacer deposition process has been performed to deposit spacer layer 132 over the mandrels 122. The spacer layer 132, for example, can be an oxide layer or other protective layer that is deposited using chemical vapor deposition (CVD), plasma enhanced CVD (PECVD), physical vapor deposition (PVD), atomic layer deposition (ALD), and/or other deposition processes.

FIG. 1D (Prior Art) provides an example embodiment 140 after a spacer open process has been performed to form spacers 142 adjacent the mandrels 122. The spacer open process can be for example a non-selective and anisotropic etch process that etches the spacer layer 132 to leave the spacers 142 adjacent to the mandrels 122. After the typical etch process of the original spacer layer 132, the height of spacers 142 is almost at the same height of the mandrels 122 and the metal layer 108 may be exposed between the mandrels 122, as shown for embodiment 140. This etch process can also be a plasma etch process including dielectric and/or organic etch process steps, as described above.

FIG. 1E (Prior Art) provides an example embodiment 150 after a mandrel pull process has been performed to remove mandrels 122 and leave spacers 142 in a spacer pattern 152 that can be later transferred to underlying layers such as metal layer 108 and dielectric layer 110. The spacer open process can be for example an etch process that selectively etches the mandrels 122 to leave the spacers 142. This etch process can also be a plasma etch process including dielectric and/or organic etch process steps, as described above.

FIG. 1F (Prior Art) provides an example embodiment 160 after a pattern transfer process has been performed to transfer the spacer pattern 152 to a pattern 162 for the metal layer 108 and dielectric layer 110. The pattern transfer process can be for example an etch process that etches the spacers 142, the metal layer 108, and the dielectric layer 110 to form the pattern 162. Depending upon the height of the spacers 142 and the duration of the etch process, a portion of the spacers 142 can be left as part of the pattern 162 transferred to the metal layer 108 and dielectric layer 110. This etch process can also be a plasma etch process including dielectric and/or organic etch process steps, as described above.

During the mandrel pull from adjacent spacers, as shown in FIG. 1E (Prior Art), a high degree of selectivity (e.g., selectivity greater than 10) is required to address lithography-related errors in the formation of the mandrels 122, particularly where self-aligned block (SAB) and/or self-aligned cut (SACut) patterning is used. However, this high level of selectivity is difficult to achieve, and local damage is often observed on the spacers. This local damage to spacers can lead to line breaks and/or other defects in the microelectronic devices manufactured using these mandrel pull process. As such, improvements to the mandrel pull from spacers are needed, particularly for advanced technique processing nodes for 7 nanometer (nm) and 5 nm processes.

SUMMARY

Embodiments are described for processing microelectronic workpieces having patterned structures to improve mandrel pull from spacers for multi-color patterning. The disclosed embodiments form patterned structures on a substrate including mandrels, form spacers adjacent the mandrels that are recessed such that a height of the spacers is less than the height of the mandrels, form protective caps over the spacers while exposing top surfaces of the mandrels, and remove the mandrels to leave a spacer pattern with cap protection. The remaining spacer pattern can then be transferred to underlying layers in additional process steps. The recessing of the spacers and formation of the protective caps tends to reduce or eliminate spacer damage suffered by prior solutions during mandrel pull from spacers for multi-color patterning. Variations can also be implemented while still taking advantage of the techniques described herein.

For one embodiment, a method of processing microelectronic workpieces is disclosed including forming patterned structures on a substrate including mandrels, forming spacers adjacent the mandrels that are recessed with respect to the mandrels such that a height of the spacers is less than the height of the mandrels, forming protective caps over the spacers while exposing top surfaces of the mandrels, and removing the mandrels to leave a spacer pattern with the protective caps.

In additional embodiments, the method further includes removing the protective caps. In further embodiments, the method includes transferring the spacer pattern to underlying layers below the spacer pattern. In still further embodiments, the underlying layers include a metal layer and a dielectric layer.

In additional embodiments, the forming spacers includes depositing a spacer layer over the mandrels and etching the spacer layer to form the spacers adjacent the mandrels. In further embodiments, the etching has a selectivity greater than 2 and less than 10 between material for the spacer layer and material for the mandrels. In still further embodiments, the etching is performed using a plasma etch process.

In additional embodiments, the removing mandrels includes etching the mandrels to leave the spacer pattern. In further embodiments, the etching has a selectivity greater than 2 and less than 10 between material for the mandrels and material for the spacers. In still further embodiments, the etching is performed using a plasma etch process.

In additional embodiments, the top surfaces for the spacers are recessed with respect to the top surfaces for the mandrels in a range from about 10 to 40 nanometers. In further embodiments, the height for the spacers is about 60 to 90 percent of the height for the mandrels.

In additional embodiments, the forming protective caps includes depositing a protection layer over the spacers and the mandrels and etching the protection layer to form the protective caps over the spacers. In further embodiments, the protection layer includes an organic planarizing layer (OPL). In still further embodiments, the protective caps cover about 60 to 80 percent of a height of an exposed portions of the adjacent mandrels that extend above top surfaces for the spacers.

In additional embodiments, the forming spacers includes depositing a spacer layer over the mandrels, depositing a protection layer over the spacer layer, etching the protection layer to leave one or more plugs between the mandrels, and etching the spacer layer to form the spacers adjacent the mandrels where the spacers include one or more connected spacers associated with the one or more plugs. In further embodiments, a plug is formed between each mandrel, and a connected spacer is associated with each plug.

In additional embodiments, the forming patterned structures includes a lithography process and one or more hardmask layers. In further embodiments, the mandrels include at least one of a silicon nitride or a silicon oxide. In still further embodiments, the protective caps include an organic material.

In additional embodiments, the method also includes controlling operating variables to ensure that at least one of etch selectivity, spacer recess amounts, or protective cap coverage amounts meet target parameters.

Different or additional features, variations, and embodiments can be implemented, if desired, and related systems and methods can be utilized, as well.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIGS. 4A-F provide an example process flow where protective caps are used to protect spacers during an etch process to pull mandrels.

FIGS. 5A-I provide an example process flow where protective caps are used to protect connected spacers during an etch process to pull mandrels and where additional process steps are used as compared to FIGS. 4A-F.

FIGS. 6A-I provide an example process flow where protective caps are used to protect spacers and connected spacers during an etch process to pull mandrels where additional process steps are used as compared to FIGS. 4A-F.

DETAILED DESCRIPTION

Embodiments are described for processing microelectronic workpieces having patterned structures to improve mandrel pull from spacers for multi-color patterning.

As the semiconductor device industry moves to ever smaller critical dimensions, the necessity of developing new process flows that meet or exceed electrical, physical, and reliability specifications for the current and next generation devices has increased. As described above, spacer damage can occur during mandrel pull processes, and this spacer damage can lead to subsequent defects and failures in completed microelectronic devices.

The disclosed embodiments apply mandrel pull process techniques that protect spacers and provide improved results as compared to prior process techniques. The disclosed embodiments can be used as part of multi-color patterning processes that include process steps that pull mandrels from adjacent spacers. These multi-color patterning processes can include deposition, lithography, and etch of mandrel, spacer and organic protection material. The deposition processes can be implemented using chemical vapor deposition (CVD), plasma enhanced CVD (PECVD), physical vapor deposition (PVD), atomic layer deposition (ALD), and/or other deposition processes. The lithography processes can be implemented using optical lithography, extreme ultraviolet (EUV) lithography, and/or other lithography processes. The etch processes can provide multi-material recess and removal and can be implemented using plasma etch processes, discharge etch processes, and/or other desired etch processes. Applications for the disclosed embodiment for mandrel pull from spacers include self-aligned block (SAB), self-aligned cut (SACut) integration, and/or other self-aligned block/cut processes. Variations can also be implemented while still taking advantage of the mandrel pull and spacer protection techniques described herein.

Figure 2:
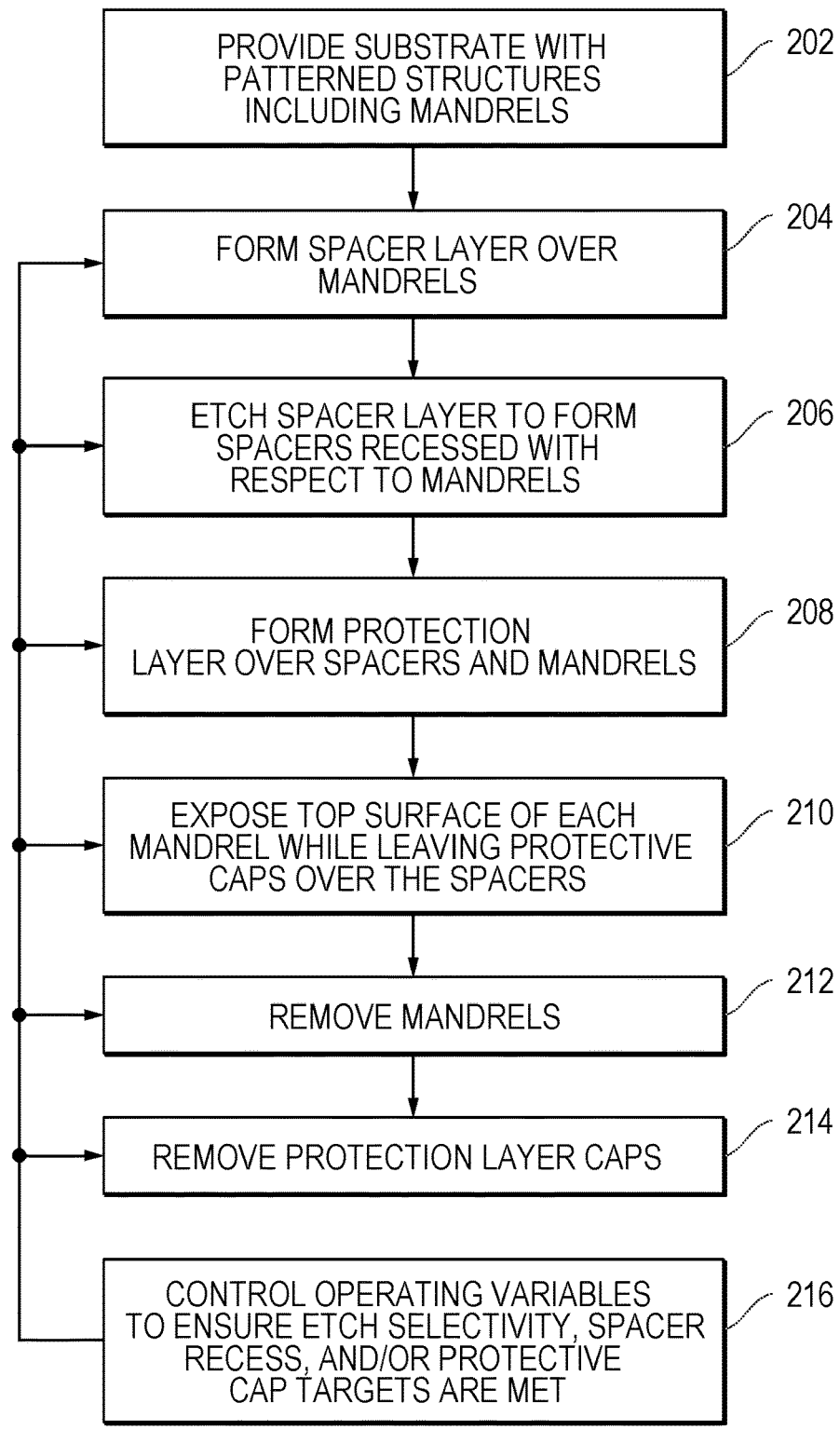
FIG. 2 is a flow diagram of an example embodiment for a manufacturing process that performs a mandrel pull while protecting adjacent spacers.

FIG. 2 is a flow diagram of an example embodiment 200 for a manufacturing process that performs a mandrel pull while protecting adjacent spacers. In step 202, a substrate is provided with patterned structures including mandrels formed over underlying layers on a substrate. In step 204, a spacer layer is formed over the mandrels. In step 206, the spacer layer is etched to form spacers, and the spacers are recessed with respect to the mandrels. In step 208, a protection layer (e.g., organic protection layer) is formed over the spacers and the mandrels. In step 210, the top surface of each of the mandrels is exposed through an etch process while leaving protective caps over the spacers. In step 212, the mandrels are removed, for example, using an etch process. In step 214, the protective caps are removed from the spacers, for example, using an etch process. In addition as represented by step 216, operating variables are controlled in steps 204, 206, 208, 210, 212, and/or 214 to ensure that the etch selectivity targets, spacer recess targets (e.g., height as a percentage of the height of a mandrel and/or target height value), protective cap targets (e.g., percent coverage of a height of an exposed portion of an adjacent mandrel) targets, and/or other target parameters are met. The operating variables may include, for example, the chamber temperature, chamber pressure, flowrates of gases, frequency and/or power applied to electrode assembly in the generation of plasma, and/or other operating variables for the processing steps. It is noted that the remaining spacer pattern after removal of the mandrels and/or the protection layer caps can then be transferred to underlying layers in additional process steps. It is further noted that additional and/or different process steps can then be used while still taking advantage of the techniques described herein for improved mandrel pull from spacers.

The techniques described herein for mandrel pull from spacers overcome issues with prior solutions that tend to damage the spacers. In part, the disclosed embodiments achieve this result by recessing the spacers and then depositing a protection layer to cover the spacers thereby protecting the spacers from material loss or damage during the mandrel pull process. The material for the protection layer can be SOH, SOC hardmask, OPL, and/or other organic material that protects the spacers during the mandrel pull process. This protection layer covers the top of the recessed spacers allowing for easier pull of the mandrels with an etch process.

For the disclosed embodiments, the spacer etch and the mandrel etch processes are not required to have the high selectivity associated with prior solutions but can have a mild selectivity (e.g., selectivity greater than 2 and less than 10) between material for the spacer layer and material for the mandrels. The spacer etch process is used to recess the spacers below the mandrels to cause the mandrels to extend above the spacers. This recessing of the spacers with respect to the mandrels provides an area for protective caps as described in more detail herein. A protection layer is then be formed and patterned so that the spacers are covered by protective caps and thereby protected during the mandrel pull process. The etch process for the mandrel pull is selective between the mandrel material and the spacer material, and this selectivity is not required to have the high selectivity associated with prior solutions but can have a mild selectivity (e.g., selectivity greater than 2 and less than 10) between material for the mandrels and material for the spacers. The protective caps, such as organic protective caps, can then be easily stripped off once the mandrel pull is completed. Further, the recessing of the spacers and formation of a protective caps prior to mandrel pull also tends to reduce local damage to spacers for more complicated process flows such as self-aligned block (SAB) processes, self-aligned cut (SACut) processes, and/or other patterned block processes. Compared to prior techniques, therefore, the disclosed embodiments reduce or eliminate spacer damage issues during mandrel pull processes. For example, prior solutions suffer from chopping of spacer top surfaces and/or other spacer damage suffered due to difficulties associated with these existing mandrel pull techniques.

Example process flows for the disclosed embodiments are described in more detail below with respect to FIGS. 4A-F, FIGS. 5A-I, and FIGS. 6A-I, although a wide variety of process flows can be implemented while still taking advantage of the techniques described herein. Before these example process flows are discussed, an embodiment 300 for an example plasma etch processing system is described with respect to FIG. 3. It is noted, however, that the techniques described herein may be utilized with a wide range of etch processing systems, and the embodiment 300 is simply one example embodiment.

Figure 3:
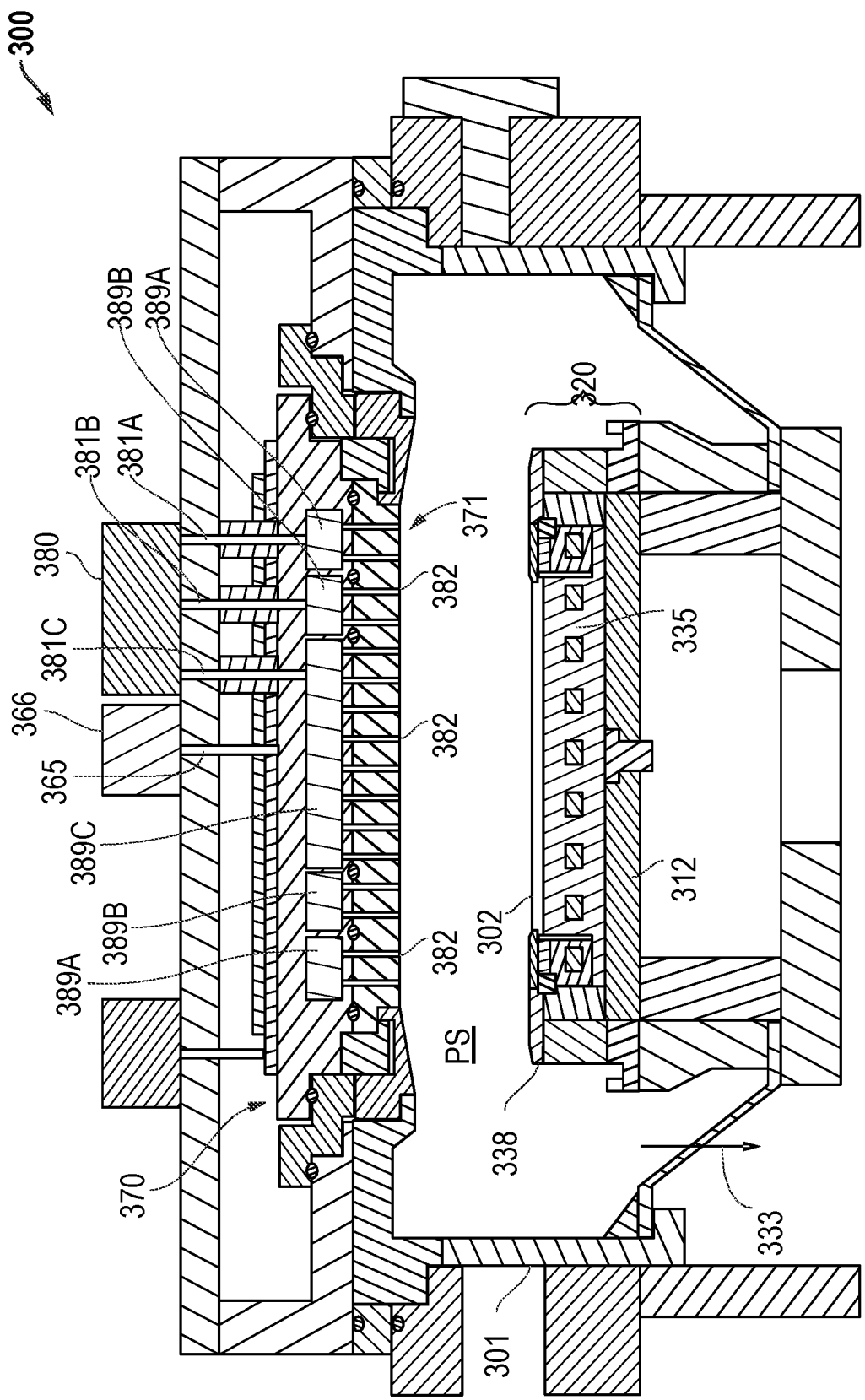
FIG. 3 is a block diagram of an example embodiment for a workpiece manufacturing system, such as a plasma processing apparatus, that can be used as an etch chamber for the embodiments described herein.

FIG. 3 is a block diagram of an example embodiment 300 for a workpiece manufacturing system, such as a plasma processing apparatus, that can be used as an etch chamber for the embodiments described herein. More particularly, FIG. 3 illustrates one example embodiment for a plasma processing apparatus merely for illustrative purposes that can be used to implement the processing techniques described herein. It will be recognized that other plasma process systems and other etch process systems may equally implement the techniques described herein. For the example embodiment 300 of FIG. 3, a schematic cross-sectional view is provided for a capacitively coupled plasma processing apparatus including a process space (PS) that provides an etch chamber for microelectronic workpieces. Alternative plasma process apparatus may also be utilized, including for example, but not limited to, inductively coupled plasma processing apparatus, microwave plasma processing apparatus, and the like. A capacitively coupled plasma processing apparatus may be particularly well suited as the electrode spacing of such apparatus allow beneficial control of gases to a localized region of the plasma space, thus providing localized plasma processing on the substrate.

The plasma processing apparatus 300 can be used for multiple operations including ashing, etching, deposition, cleaning, plasma polymerization, plasma-enhanced chemical vapor deposition (PECVD), atomic layer deposition (ALD) and so forth. The structure of a plasma processing apparatus 300 is well known, and the particular structure provided herein is merely exemplary. Plasma processing can be executed within processing chamber 301, which can be a vacuum chamber made of a metal such as aluminum or stainless steel. The processing chamber 301 defines a processing vessel providing a process space (PS) for plasma generation. An inner wall of the processing vessel can be coated with alumina, yttria, or other protectant. The processing vessel can be cylindrical in shape or have other geometric configurations.

At a lower, central area within the processing chamber 301, a susceptor 312 (which can be disc-shaped) can serve as a mounting table on which, for example, a substrate 302 to be processed (such as a semiconductor wafer) can be mounted. Substrate 302 can be moved into the processing chamber 301 through a loading/unloading port and gate valve. Susceptor 312 forms part of a lower electrode assembly 320 as an example of a second electrode acting as a mounting table for mounting substrate 302 thereon. The susceptor 312 can be formed of, e.g., an aluminum alloy. Susceptor 312 is provided thereon with an electrostatic chuck (as part of the lower electrode assembly) for holding the substrate 302. The electrostatic chuck is provided with an electrode 335. Electrode 335 is electrically connected to direct current (DC) power source, not shown. The electrostatic chuck attracts the substrate 302 thereto via an electrostatic force generated when DC voltage from the DC power source is applied to the electrode 335. The susceptor 312 can be electrically connected with a high-frequency power source via a matching unit. For other embodiments and processing chambers, two or more power sources can be used and connected to electrode 335 and/or other electrodes within the processing chambers. This high-frequency power source (a second power source) can output a high-frequency voltage in a range from, for example, 2 MHz to 20 MHz. Applying high frequency bias power causes ions, in plasma generated in the processing chamber 301, to be attracted to substrate 302. A focus ring assembly 338 is provided on an upper surface of the susceptor 312 to surround the electrostatic chuck.

An exhaust path 333 can be formed through one or more exhaust ports (not shown) which connect to a gas exhaust unit. The gas exhaust unit can include a vacuum pump such as a turbo molecular pump configured to pump out the plasma processing space within the processing chamber 301 to a desired vacuum condition. The gas exhaust unit evacuates the inside of the processing chamber 301 thereby depressurizing the inner pressure thereof down to the desired degree of vacuum.

An upper electrode assembly 370 is an example of a first electrode and is positioned vertically above the lower electrode assembly 320 to face the lower electrode assembly 320 in parallel. The plasma generation space or process space (PS) is defined between the lower electrode assembly 320 and the upper electrode assembly 370. The upper electrode assembly 370 includes an inner upper electrode 371, having a disk shape, and an outer upper electrode which may be annular and surrounding a periphery of the inner upper electrode 371. The inner upper electrode 371 also functions as a processing gas inlet for injecting a specific amount of processing gas into the process space (PS) above substrate 302 mounted on the lower electrode assembly 320. The upper electrode assembly 370 thereby forms a showerhead. More specifically, the inner upper electrode 371 includes gas injection openings 382.

The upper electrode assembly 370 may include one or more buffer chamber(s) 389A, 389B, and 389C. The buffer chambers are used for diffusing process gas and can define a disk-shaped space. Processing gas from a process gas supply system 380 supplies gas to the upper electrode assembly 370. The process gas supply system 380 can be configured to supply a processing gas for performing specific processes, such as film-forming, etching, and the like, on the substrate 302. The process gas supply system 380 is connected to gas supply lines 381A, 381B, and 381C forming a processing gas supply path. The gas supply lines are connected to the buffer chambers of the inner upper electrode 371. The processing gas can then move from the buffer chambers to the gas injection openings 382 at a lower surface thereof. A flow rate of processing gas introduced into the buffer chambers 389A-C can be adjusted by, e.g., by using a mass flow controller. Further, the processing gas introduced is discharged from the gas injection openings 382 of the electrode plate (showerhead electrode) to the process space (PS). The inner upper electrode 371 functions in part to provide a showerhead electrode assembly.

As shown in FIG. 3, three buffer chambers 389A, 389B, and 389C are provided corresponding to edge buffer chamber 389A, middle buffer chamber 389B, and center buffer chamber 389C. Similarly, gas supply lines 381A, 381B, and 381C may be configured as edge gas supply line 381A, middle gas supply line 381B and center gas supply line 381C. The buffer chambers are provided in a manner corresponding to different localized regions of the substrate in this case edge, middle and center. As will be discussed more below, these regions may correspond to specific process plasma process conditions for localized regions of the substrate 302. It will be recognized that the use of three localized regions is merely exemplary. Thus, the plasma processing apparatus may be configured to provided localize plasma process conditions on any number of regions of the substrate. It is further again noted that any of a variety of configurations may be utilized, and the techniques described herein are not limited to the manner in which the process gas supply system 380 is configured to split the gas flows to the various buffer chambers.

The upper electrode assembly 370 is electrically connected with a high-frequency power source (not shown) (first high-frequency power source) via a power feeder 365 and a matching unit 366. The high-frequency power source can output a high-frequency voltage having a frequency of 40 MHz (megahertz) or higher (e.g., 60 MHz), or can output a very high frequency (VHF) voltage having a frequency of 30-300 MHz. This power source can be referred to as the main power supply as compared to a bias power supply. It is noted for certain embodiments there is no power source for the upper electrodes, and two power sources are connected to the bottom electrode. Other variations could also be implemented.

Components of the plasma processing apparatus can be connected to, and controlled by, a control unit, which in turn can be connected to a corresponding memory storage unit and user interface (all not shown). Various plasma processing operations can be executed via the user interface, and various plasma processing recipes and operations can be stored in a storage unit. Accordingly, a given substrate can be processed within the plasma processing chamber with various microfabrication techniques. In operation, the plasma processing apparatus uses the upper and lower electrodes to generate a plasma in the process space (PS). This generated plasma can then be used for processing a target substrate (such as substrate 302 or any material to be processed) in various types of treatments such as plasma etching, chemical vapor deposition, treatment of semiconductor material, glass material and large panels such as thin-film solar cells, other photovoltaic cells, and organic/inorganic plates for flat panel displays, etc.

Looking now to FIGS. 4A-D, 5A-I, and 6A-I, example process flow embodiments are provided that protect spacers during mandrel pull processes. It is noted that the patterned structures and features shown in these embodiments are merely example patterned structures and features, and the disclosed techniques can be used for other patterned structures and features as well. It is further noted that additional and/or different process steps to those shown can also be implemented with respect to the microelectronic workpiece being manufactured while still taking advantage of the techniques described herein.

FIGS. 4A-F provide an example process flow where protective caps 432 are used to protect spacers 402 during an etch process to pull mandrels 122.

Figure 1A:
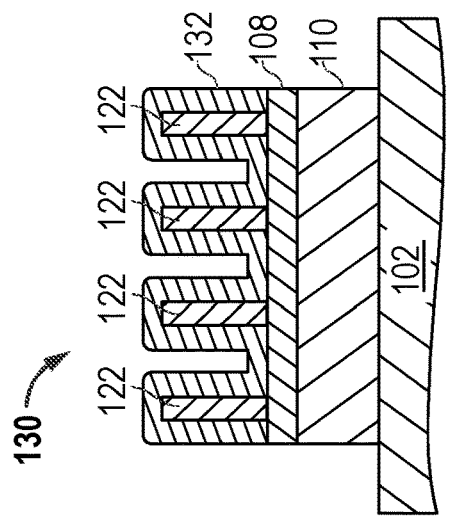
FIGS. 1A-F (Prior Art) provide example embodiments for a traditional process flow for self-aligned double patterning (SADP) process, sidewall image transfer (SIT) patterning process, and/or other patterning process that includes a mandrel pull from spacers.
Figure 1B:
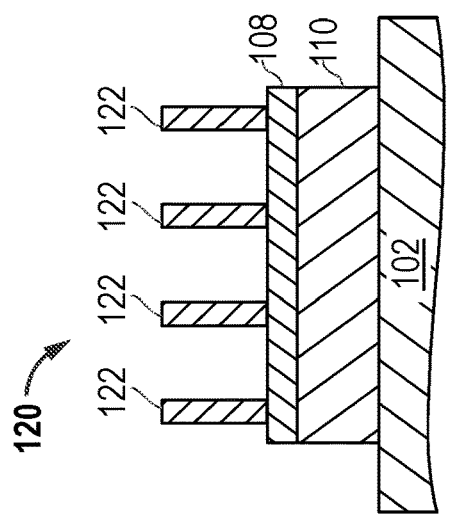
Figure 1C:
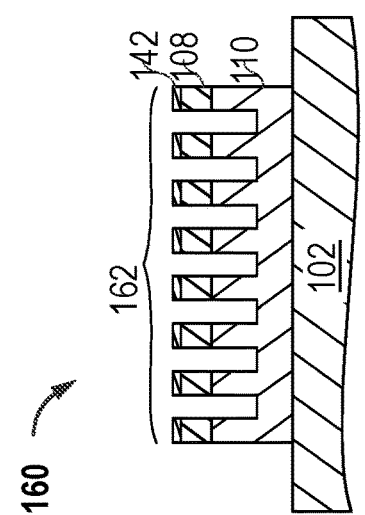

FIG. 4A provides an embodiment 400 for a substrate 102 with patterned structures that matches embodiment 130 from FIG. 1C (Prior Art) after a spacer deposition process has been performed to form spacer layer 132 over the mandrels 122. Underlying layers can also include a metal layer 108 and a dielectric layer 110 on top of the substrate 102 such as a semiconductor substrate for a microelectronic workpiece, although different underlying layers can also be provided. As described above, the spacer layer 132, for example, can be an oxide layer or other protective layer that is deposited using chemical vapor deposition (CVD), plasma enhanced CVD (PECVD), physical vapor deposition (PVD), atomic layer deposition (ALD), and/or other deposition processes. Additional and/or different deposition processes can also be used.

Figure 1D:
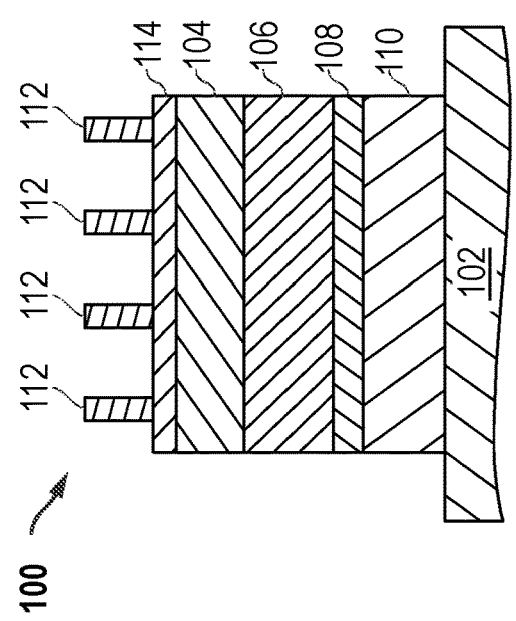

FIG. 4B provides an example embodiment 410 after a spacer open process has been performed to form spacers 402 adjacent the mandrels 122. As compared to prior solutions as shown with respect to FIG. 1D (Prior Art), the spacer open process for embodiment 410 recesses the top surfaces for the spacers 402 with respect to the top surfaces for the mandrels 122. For example, the top surfaces for the mandrels 122 can extend above the top surfaces of the recessed spacers 402 in a range from about 10 to 40 nanometers (nm) where the height of the mandrels is about 100 nm. As another example, the spacers 402 can be recessed with respect to the mandrels 122 such that the height of the remaining spacers 402 is from about 60 to 90 percent of the height of the mandrels 122. The spacer open process can be for example an anisotropic etch process that selectively etches the spacer layer 132 to leave the spacers 402 adjacent to the mandrels 122. After the etch process of the original spacer layer 132, the metal layer 108 is also exposed between the mandrels 122, as shown for embodiment 410. It is noted that the etch process can be a plasma etch process including dielectric etch process steps, either continuous wave or quasi atomic layer etch (QALE), and this plasma etch can include plasma containing fluorocarbons, oxygen, nitrogen, hydrogen, argon, and/or other gases. It is also noted that the spacer layer etch can have a mild selectivity (e.g., selectivity greater than 2 and less than 10) between material for the spacer layer 132 and material for the mandrels 122. Additional and/or different etch processes can also be used.

FIG. 4C provides an example embodiment 420 after a protection layer 422 has been formed over the spacers 402 and mandrels 122. For one embodiment, the material for the protection layer 422 can be SOH, SOC hardmask, OPL, and/or other organic material that protects the spacers during the mandrel pull process. The protection layer 422 can be formed through a deposition process, such as for example, a spin coating deposition process, a plasma deposition process, and/or another deposition process. For a plasma deposition process, a precursor gas mixture can be used including but not limited to hydrocarbons, fluorocarbons, or nitrogen containing hydrocarbons in combination with one or more dilution gases (e.g., argon, nitrogen, etc.) at a variety of pressure, power, flow and temperature conditions. Additional and/or different deposition processes can also be used.

FIG. 4D provides an example embodiment 430 after the protection layer 422 has been etched to expose the top surfaces of the mandrels 122 and to leave protective caps 432 that cover the spacers 402. For one embodiment, the protection layer 422 is etched so that the protective caps 432 cover about 60 to 80 percent of the height of the exposed portion of each mandrel 122 that extends above the top surfaces of the spacers 402. For this etch of the protection layer 422, standard organic ash steps can be used including but not limited to plasma etches containing oxygen, carbon dioxide, carbon monoxide, nitrogen, hydrogen, methane, argon, and/or other gases under a variety of pressure and power conditions. Additional and/or different etch processes can also be used.

Figure 1E:
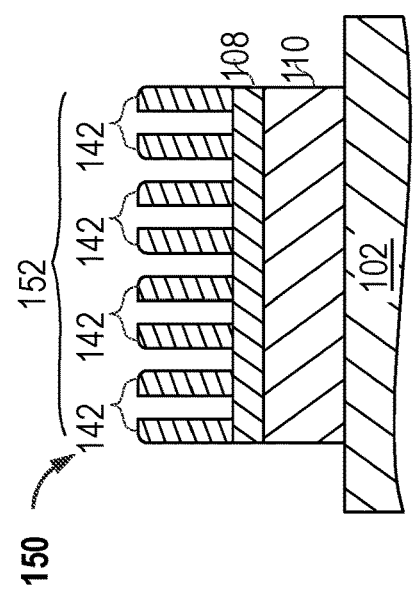
Figure 1F:
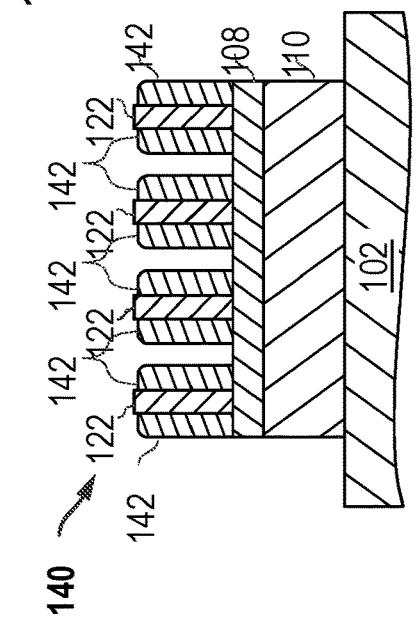

FIG. 4E provides an example embodiment 440 after a mandrel pull process has been performed to remove mandrels 122 and leave spacers 402 above the underlying layers. The spacer open process can be for example an etch process that selectively etches the mandrels 122 to leave the spacers 402 that are capped with protective caps 432. As compared to prior mandrel pull processes as shown in FIG. 1E (Prior Art), the selectivity requirements are reduced due to the formation of the protective caps 432 to protect the spacers 402. For example, the mandrel etch process can have a mild selectivity (e.g., selectivity greater than 2 and less than 10) between material for the mandrels 122 and material for the spacers 402. It is noted that the mandrel pull process can be a plasma etch process including organic etch process steps, and this plasma etch can include plasma containing fluorocarbons, oxygen, nitrogen, hydrogen, argon, and/or other gases. Additional and/or different etch processes can also be used.

FIG. 4F provides an example embodiment 450 after removal of the protective caps 432 to leave spacers 402 in a spacer pattern 452 that can be later transferred to underlying layers such as metal layer 108 and dielectric layer 110. The spacer pattern 452 for the spacers 402 that remains as shown in embodiment 450 matches the spacer pattern 152 for embodiment 150 from FIG. 1E (Prior Art). As described herein, subsequent process steps can be performed, for example, to transfer the spacer pattern 452 to underlying layers such as metal layer 108 and dielectric layer 110. For this removal of the protective caps 432, standard organic ash steps can be used including but not limited to plasma etches containing oxygen, carbon dioxide, carbon monoxide, nitrogen, hydrogen, methane, argon, and/or other gases under a variety of pressure and power conditions. Additional and/or different etch processes can also be used.

FIGS. 5A-I provide an example process flow where protective caps 552 are used to protect connected spacers 532 during an etch process to pull mandrels 122 and where additional process steps are used as compared to FIGS. 4A-F.

FIG. 5A provides an embodiment 500 for a substrate 102 with patterned structures that matches embodiment 400 from FIG. 4A after a spacer deposition process has been performed to deposit spacer layer 132 over the mandrels 122. As indicated above, the spacer layer 132, for example, can be an oxide layer or other protective layer that is deposited using chemical vapor deposition (CVD), plasma enhanced CVD (PECVD), physical vapor deposition (PVD), atomic layer deposition (ALD), and/or other deposition processes. Additional and/or different deposition processes can also be used.

FIG. 5B provides an example embodiment 510 after a protection layer 512 has been formed over the spacer layer 132 and mandrels 122. For one embodiment, the material for the protection layer 512 can be SOH, SOC hardmask, OPL, and/or other organic material that protects the spacers during the mandrel pull process. The protection layer 512 can be formed through a deposition process, such as for example, a spin coating deposition process, a plasma deposition process, and/or another deposition process. For a plasma deposition process, a precursor gas mixture can be used including but not limited to hydrocarbons, fluorocarbons, or nitrogen containing hydrocarbons in combination with one or more dilution gases (e.g., argon, nitrogen, etc.) at a variety of pressure, power, flow and temperature conditions. Additional and/or different deposition processes can also be used.

FIG. 5C provides an example embodiment 520 after the protection layer 512 has been etched to leave plugs 522 that cover wells between the mandrels 122. For this etch of the protection layer 512, standard organic etch steps can be used including but not limited to plasma etches containing oxygen, carbon dioxide, carbon monoxide, nitrogen, hydrogen, methane, argon, and/or other gases under a variety of pressure and power conditions. Additional and/or different etch processes can also be used.

FIG. 5D provides an example embodiment 530 after a spacer open process has been performed to form connected spacers 532 adjacent the mandrels 122 and to remove the plugs 522. Similar to embodiment 410 of FIG. 4B, the spacer open process for embodiment 530 recesses the top surfaces for the connected spacers 532 with respect to the top surfaces for the mandrels 122. For example, the top surfaces for the mandrels 122 can extend above the top surfaces of the recessed spacers 402 in a range from about 10 to 40 nm where the height of the mandrels is about 100 nm. As another example, the connected spacers 532 can be recessed with respect to the mandrels 122 such that the height of the remaining connected spacers 532 is from about 60 to 90 percent of the height of the mandrels 122. The spacer open process can be for example an anisotropic etch process that etches the spacer layer 132 to leave the connected spacers 532 adjacent to the mandrels 122. As described above with respect to FIG. 4B, this spacer etch can use a mild selectivity. It is noted that the etch process can be a plasma etch process including dielectric etch process steps, and this plasma etch can include plasma containing fluorocarbons, oxygen, nitrogen, hydrogen, argon, and/or other gases. It is also noted that the plugs 522 can be removed using an etch process, such as for example, standard organic ash steps including but not limited to plasma etches containing oxygen, carbon dioxide, carbon monoxide, nitrogen, hydrogen, methane, argon, and/or other gases under a variety of pressure and power conditions. Additional and/or different etch processes can also be used.

FIG. 5E provides an example embodiment 540 after a protection layer 542 has been formed over the connected spacers 532 and mandrels 122. For one embodiment, the material for the protection layer 542 can be SOH, SOC hardmask, OPL, and/or other organic material that protects the spacers during the mandrel pull process. The protection layer 542 can be formed through a deposition process, such as for example, a plasma process using a precursor gas mixture including but not limited to hydrocarbons, fluorocarbons, or nitrogen containing hydrocarbons in combination with one or more dilution gases (e.g., argon, nitrogen, etc.) at a variety of pressure, power, flow and temperature conditions. Additional and/or different deposition processes can also be used.

FIG. 5F provides an example embodiment 550 after the protection layer 542 has been etched to expose the top surfaces of the mandrels 122 and to leave protective caps 552 that cover the connected spacers 532. For one embodiment, the protection layer 542 is etched so that the protective caps 532 cover about 60 to 80 percent of the height of the exposed portion of each mandrel 122 that extends above the top surfaces of the connected spacers 532. For this etch of the protection layer 542, standard organic ash steps can be used including but not limited to plasma etches containing oxygen, carbon dioxide, carbon monoxide, nitrogen, hydrogen, methane, argon, and/or other gases under a variety of pressure and power conditions. Additional and/or different etch processes can also be used.

Figure 5I:
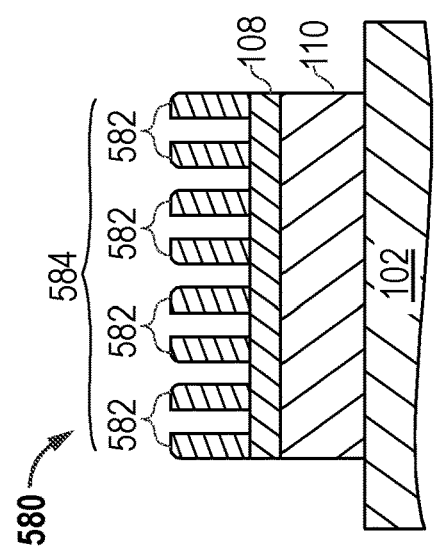
Figure 5H:
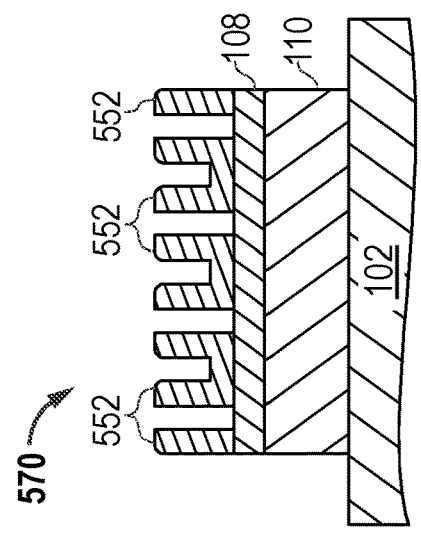
Figure 5G:
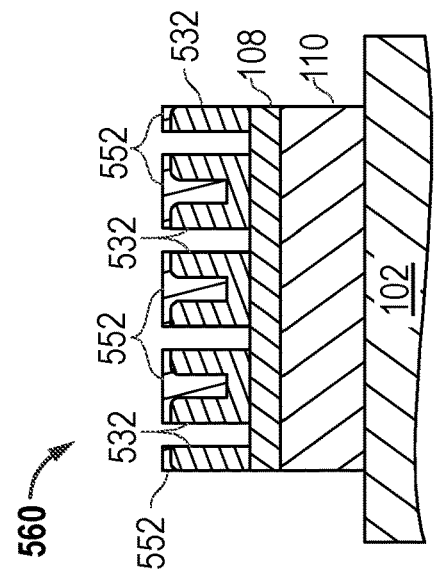

FIG. 5G provides an example embodiment 560 after a mandrel pull process has been performed to remove mandrels 122 and leave connected spacers 532 above the underlying layers. The spacer open process can be for example an etch process that selectively etches the mandrels 122 to leave the connected spacers 532. As indicated above with respect to FIG. 4E, the selectivity requirements are reduced as compared to prior solutions due to the formation of the protective caps 552 to protect the connected spacers 532, and this mandrel etch can therefore use a mild selectivity. It is noted that the mandrel pull process can be a plasma etch process including organic etch process steps, and this plasma etch can include plasma containing fluorocarbons, oxygen, nitrogen, hydrogen, argon, and/or other gases. Additional and/or different etch processes can also be used.

FIG. 5H provides an example embodiment 570 after removal of the protective caps 552 to leave connected spacers 532. For this removal of the protective caps 552, standard organic ash steps can be used including but not limited to plasma etches containing oxygen, carbon dioxide, carbon monoxide, nitrogen, hydrogen, methane, argon, and/or other gases under a variety of pressure and power conditions. Additional and/or different etch processes can also be used.

FIG. 5I provides an example embodiment 580 after removal of the horizontal connection portions of the protective caps 552 to leave spacers 582 in a spacer pattern 584 that can be later transferred to underlying layers such as metal layer 108 and dielectric layer 110. The spacer pattern 584 for the spacers 582 that remains as shown in embodiment 580 matches the spacer pattern 452 for embodiment 450 from FIG. 4F. Subsequent process steps can be performed, for example, to transfer the spacer pattern 584 to underlying layers such as metal layer 108 and dielectric layer 110. For this removal of the horizontal portions of the protective caps 552, standard organic ash steps can be used including but not limited to plasma etches containing oxygen, carbon dioxide, carbon monoxide, nitrogen, hydrogen, methane, argon, and/or other gases under a variety of pressure and power conditions. Additional and/or different etch processes can also be used.

FIGS. 6A-I provide an example process flow where protective caps 652 are used to protect spacers 632/634 during an etch process to pull mandrels 122 where additional process steps are used as compared to FIGS. 4A-F.

Figure 6C:
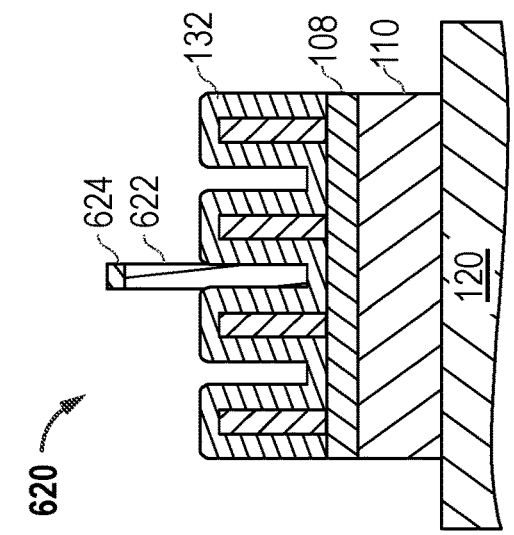
Figure 6B:
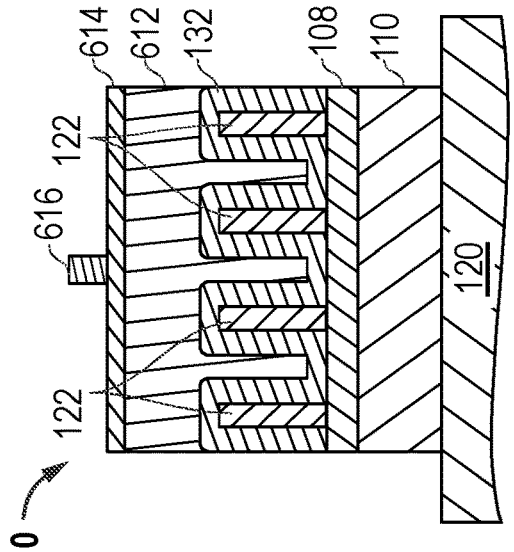
Figure 6A:
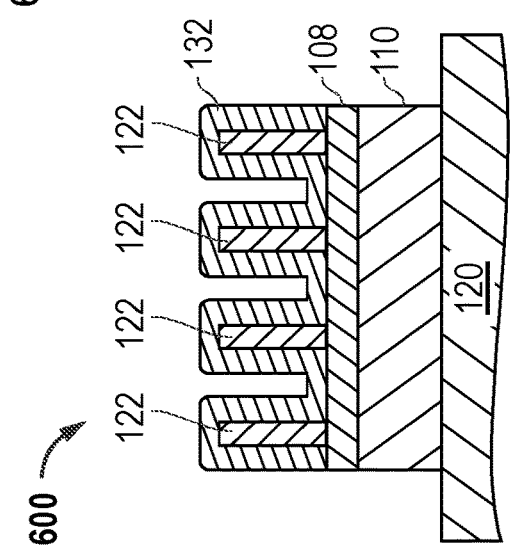

FIG. 6A provides an embodiment 600 for a substrate 102 with patterned structures that matches embodiment 400 from FIG. 4A after a spacer deposition process has been performed to deposit spacer layer 132 over the mandrels 122. As indicated above, the spacer layer 132, for example, can be an oxide layer or other protective layer that is deposited using chemical vapor deposition (CVD), plasma enhanced CVD (PECVD), physical vapor deposition (PVD), atomic layer deposition (ALD), and/or other deposition processes. Additional and/or different deposition processes can also be used.

FIG. 6B provides an example embodiment 610 after a protection layer 612 has been formed over the spacer layer 132 and mandrels 122. For one embodiment, the material for the protection layer 612 can be SOH, SOC hardmask, OPL, and/or other organic material that protects the spacers during the mandrel pull process. A hardmask layer 614 and a pillar 616 of photoresist material have also been formed, for example, using a deposition and lithography patterning process. The protection layer 612 can be formed through a deposition process, such as for example, a plasma process using a precursor gas mixture including but not limited to hydrocarbons, fluorocarbons, or nitrogen containing hydrocarbons in combination with one or more dilution gases (e.g., argon, nitrogen, etc.) at a variety of pressure, power, flow and temperature conditions. Additional and/or different deposition processes can also be used.

FIG. 6C provides an example embodiment 620 after the protection layer 612 and hardmask layer 614 have been etched to leave a plug 622 and hardmask cap 624, and the pillar 616 has been removed. For this etch of the protection layer 612 and hardmask layer 614 and removal of pillar 616, standard organic ash steps can be used including but not limited to plasma etches containing oxygen, carbon dioxide, carbon monoxide, nitrogen, hydrogen, methane, argon, and/or other gases under a variety of pressure and power conditions. Additional and/or different etch processes can also be used.

FIG. 6D provides an example embodiment 630 after a spacer open process has been performed to form spacers 632 and connected spacers 634 adjacent the mandrels 122 as well as to remove the plug 622 and hardmask cap 624. Similar to embodiment 410 of FIG. 4B, the spacer open process for embodiment 630 recesses the top surfaces for the spacers 632 and connected spacers 634 with respect to the top surfaces for the mandrels 122. For example, the top surfaces for the mandrels 122 can extend above the top surfaces of the recessed spacers 402 in a range from about 10 to 40 nm where the height of the mandrels is about 100 nm. As another example, the spacers 632 and connected spacers 634 can be recessed with respect to the mandrels 122 such that the height of the remaining spacers 632/634 is from about 60 to 90 percent of the height of the mandrels 122. The spacer open process can be for example an anisotropic etch process that selectively etches the spacer layer 132 to leave the spacers 632 and connected spacers 634 adjacent to the mandrels 122. As described above with respect to FIG. 4B, this spacer etch can use a mild selectivity. It is noted that the etch process can be a plasma etch process including dielectric etch process steps, and this plasma etch can include plasma containing fluorocarbons, oxygen, nitrogen, hydrogen, argon, and/or other gases. It is also noted that the plug 622 and hardmask cap 624 can be removed using an etch process, such as for example, standard organic ash steps including but not limited to plasma etches containing oxygen, carbon dioxide, carbon monoxide, nitrogen, hydrogen, methane, argon, and/or other gases under a variety of pressure and power conditions. Additional and/or different etch processes can also be used.

FIG. 6E provides an example embodiment 640 after a protection layer 642 has been formed over the spacers 632, connected spacers 634, and mandrels 122. For one embodiment, the material for the protection layer 642 can be SOH, SOC hardmask, OPL, and/or other organic material that protects the spacers during the mandrel pull process. The protection layer 642 can be formed through a deposition process, such as for example, a spin coating deposition process, a plasma deposition process, and/or another deposition process. For a plasma deposition process, a precursor gas mixture can be used a including but not limited to hydrocarbons, fluorocarbons, or nitrogen containing hydrocarbons in combination with one or more dilution gases (e.g., argon, nitrogen, etc.) at a variety of pressure, power, flow and temperature conditions. Additional and/or different deposition processes can also be used.

FIG. 6F provides an example embodiment 650 after the protection layer 642 has been etched to expose the top surfaces of the mandrels 122 and to leave protective caps 652 that cover the spacers 632 and connected spacers 634. For one embodiment, the protection layer 642 is etched so that the protective caps 652 cover about 60 to 80 percent of the height of the exposed portion of each mandrel 122 that extends above the top surfaces of the spacers 632 and connected spacers 634. For this etch of the protection layer 642, standard organic ash steps can be used including but not limited to plasma etches containing oxygen, carbon dioxide, carbon monoxide, nitrogen, hydrogen, methane, argon, and/or other gases under a variety of pressure and power conditions. Additional and/or different etch processes can also be used.

FIG. 6G provides an example embodiment 660 after a mandrel pull process has been performed to remove mandrels 122 and leave spacers 632 and connected spacer 634 above the underlying layers. The spacer open process can be for example an etch process that selectively etches the mandrels 122 to leave the spacers 632 and connected spacer 634. As indicated above with respect to FIG. 4E, the selectivity requirements are reduced as compared to prior solutions due to the formation of the protective caps 652 to protect the spacers 632 and connected spacer 634, this mandrel etch can use a mild selectivity. It is noted that the mandrel pull process can be a plasma etch process including organic etch process steps, and this plasma etch can include plasma containing fluorocarbons, oxygen, nitrogen, hydrogen, argon, and/or other gases. Additional and/or different etch processes can also be used.

FIG. 6H provides an example embodiment 670 after removal of the protective caps 652 to leave spacers 632 and connected spacers 634 in a pattern 672 that can be later transferred to underlying layers such as metal layer 108 and dielectric layer 110. For this removal of the protective caps 652, standard organic ash steps can be used including but not limited to plasma etches containing oxygen, carbon dioxide, carbon monoxide, nitrogen, hydrogen, methane, argon, and/or other gases under a variety of pressure and power conditions. Additional and/or different etch processes can also be used.

FIG. 6I provides an example embodiment 680 after a pattern transfer process has been performed to transfer the pattern 672 for the spacers 632 and connected spacers 634 to a spacer pattern 682 for the metal layer 108 and dielectric layer 110. The pattern transfer process can be for example an etch process that etches the spacers 632, the connected spacer 634, the metal layer 108, and the dielectric layer 110 to form the spacer pattern 682. This etch process can also be a plasma etch process including dielectric and/or organic etch process steps, as described above. Additional and/or different etch processes can also be used.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for annealing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method of processing microelectronic workpieces, comprising:
    forming patterned structures on a substrate including mandrels;
    forming spacers adjacent the mandrels that are recessed with respect to the mandrels such that a height for the spacers is less than a height for the mandrels;
    forming protective craps over top surfaces of the spacers while exposing top surfaces of the mandrels; and
    removing the mandrels to leave a spacer pattern with the protective caps, wherein after forming of the protective caps and prior to removing of the mandrels, the protective caps extend along sides of the mandrels to a height below the top surfaces of the mandrels.

2. The method of claim 1, further comprising removing the protective caps.

3. The method of claim 2, further comprising transferring the spacer pattern to underlying layers below the spacer pattern.

4. The method of claim 3, wherein the underlying layers comprise a metal layer and a dielectric layer.

5. The method of claim 1, wherein the forming spacers comprises:
depositing a spacer layer over the mandrels; and
etching the spacer layer to form the spacers adjacent the mandrels that are recessed with respect to the mandrels.

6. The method of claim 5, wherein the etching has a selectivity greater than 2 and less than 10 between material for the spacer layer and material for the mandrels.

7. The method of claim 6, wherein the etching is performed using a plasma etch process.

8. The method of claim 1, wherein the removing the mandrels comprises etching the mandrels to leave the spacer pattern.

9. The method of claim 8, wherein the etching has a selectivity greater than 2 and less than 10 between material for the mandrels and material for the spacers.

10. The method of claim 9, wherein the etching is performed using a plasma etch process.

11. The method of claim 1, wherein the height for the spacers is about 60 to 90 percent of the height for the mandrels.

12. The method of claim 1, wherein the forming spacers comprises:
depositing a spacer layer over the mandrels;
depositing a protection layer over the spacer layer;
etching the protection layer to leave one or more plugs between the mandrels; and
etching the spacer layer to form the spacers adjacent the mandrels, the spacers comprising one or more connected spacers associated with the one or more plugs.

13. The method of claim 1, wherein the forming patterned structures comprises a lithography process and one or more hardmask layers.

14. The method of claim 1, wherein the mandrels comprises at least one of silicon nitride, silicon oxide, metal nitride, or metal oxide.

15. The method of claim 1, wherein the protective caps comprise an organic material.

16. The method of claim 1, further comprising controlling operating variables to ensure that at least one of etch selectivity, spacer recess amounts, or protective cap coverage amounts meet target parameters.

17. The method of claim 1, wherein the forming of the protective caps includes forming a protection layer that extends over the top surfaces of the spacers and along sides of the spacers such that the protection layer connects adjacent spacers and fills portions between adjacent spacers.

18. The method of claim 17, wherein the protection layer is formed over the top surfaces of the mandrels and etched back to expose the top surfaces of the mandrels while leaving the protective caps on the top surfaces of the spacers.

19. The method of claim 17, further comprising:
after removing the mandrels, removing portions of the protection layer that connect and fill between adjacent spacers.

20. The method of claim 17, further comprising:
after removing the mandrels, removing the protection layer to expose portions of the spacers previously covered by the protection layer; and
after removing the protection layer, etching an underlying layer e the spacers to transfer a pattern of the spacers to the underlying layer.

21. A method of processing microelectronic workpieces, comprising:
forming patterned structures on a substrate including mandrels;
forming spacers adjacent the mandrels that re recessed with respect to the mandrels such that a height for the spacers is less than a height for the mandrels;
forming protective caps over top surfaces of the spacers while exposing top surfaces of the mandrels; and
removing the mandrels to leave a spacer pattern with the protective caps,
wherein top surfaces for the spacers are recessed with respect to top surfaces for the mandrels in a range from about 10 to 40 nanometers.

22. A method of processing microelectronic workpieces, comprising:
forming patterned structures on a substrate including mandrels;
forming spacers adjacent the mandrels that are recessed with respect to the mandrels such that a height for the spacers is less than a height for the mandrels;
forming protective caps over the spacers that are recessed with respect to the mandrels while exposing top surfaces of the mandrels; and
removing the mandrels to leave a spacer pattern with the protective caps;
wherein the forming protective caps comprises:
depositing a protection layer over the spacers and the mandrels; and
etching the protection layer to form the protective caps over the spacers.

23. The method of claim 22, wherein the protection layer comprises an organic planarizing layer (OPL).

24. The method of claim 22, wherein the protective caps cover about 60 to 80 percent of a height for exposed portions of adjacent mandrels that extend above top surfaces for the spacers.

25. The method of claim 22, wherein:
the etching of the protection layer exposes the top surfaces of each of the mandrels;
the removing of the mandrels removes each of the mandrels while leaving adjacent spacers with a protective cap above a top of each adjacent spacer.

26. A method of processing microelectronic workpieces, comprising:
forming patterned structures on a substrate including mandrels;
forming spacers adjacent the mandrels that are recessed with respect to the mandrels such that a height for the spacers is less than a height for the mandrels;
forming protective caps over the spacers that are recessed with respect to the mandrels while exposing top surfaces of the mandrels; and
removing the mandrels to leave a spacer pattern with the protective caps;
wherein the forming spacers comprises:
depositing a spacer layer over the mandrels;
depositing a protection layer over the spacer layer;
etching the protection layer to leave one or more plugs between the mandrels; and etching the spacer layer to form the spacers adjacent the mandrels, the spacers comprising one or more connected spacers associated with the one or more plugs;

wherein a plug is formed between each mandrel, and wherein a connected spacer is associated with at least some of the plugs.

27. The method of claim 26, wherein:

the etching of the protection layer exposes the top surfaces of each of the mandrels; and after removing of the mandrels portions of the protection layer remain over tops of each of the spacers.

* * * * *